United States Patent [19]

Ishibashi

[11] Patent Number: 5,394,751
[45] Date of Patent: Mar. 7, 1995

[54] METHOD OF PRODUCING SEMICONDUCTOR PRESSURE SENSOR

[75] Inventor: Kiyoshi Ishibashi, Itami, Japan

[73] Assignee: Mitsubishi Denki Kabushiki Kaisha, Tokyo, Japan

[21] Appl. No.: 8,366

[22] Filed: Jan. 22, 1993

[30] Foreign Application Priority Data

Jan. 24, 1992 [JP] Japan .................. 4-010825

[51] Int. Cl.⁶ .............................................. G01L 7/00
[52] U.S. Cl. ...................................... 73/756; 257/676; 257/696
[58] Field of Search ................. 73/756, 706, 720, 721, 73/726, 727, 708; 338/4, 42; 29/621.1; 257/676, 696, 666; 437/209, 217, 220

[56] References Cited

U.S. PATENT DOCUMENTS

| | | | |
|---|---|---|---|
| 4,314,225 | 2/1982 | Tominaga et al. | 73/721 |
| 4,496,965 | 1/1985 | Orcutt et al. | 257/666 |
| 4,658,651 | 4/1987 | Le | 73/708 |
| 4,670,730 | 6/1987 | Takeda et al. | 73/726 |
| 4,796,078 | 1/1989 | Phelps, Jr. et al. | 257/696 |
| 4,874,722 | 10/1989 | Bednarz et al. | 437/209 |
| 4,942,383 | 7/1990 | Lam et al. | 73/720 |
| 5,089,879 | 2/1992 | Komenaka | 257/676 |
| 5,161,304 | 11/1992 | Queyssac et al. | 257/676 |
| 5,223,739 | 6/1993 | Katsumata et al. | 257/676 |

Primary Examiner—Richard E. Chilcot, Jr.
Assistant Examiner—William L. Oen
Attorney, Agent, or Firm—Leydig, Voit & Mayer

[57] ABSTRACT

A semiconductor pressure sensor has a semiconductor pressure sensing element sensitive to pressure and a hollow package accommodating the semiconductor pressure sensing element. The semiconductor pressure sensor also has a first lead frame portion having a displaced die pad to which the semiconductor pressure sensor is die bonded and a plurality of suspension leads through which the die pad is suspended at its opposing sides. The semiconductor pressure sensor also has a second lead frame portion having a plurality of suspension leads which provide electrical connections between the semiconductor pressure sensing element and external devices. The package includes a resin base accommodating the semiconductor pressure sensing element fixed to the die pad and a resin cap bonded to the resin base with the first and second lead frame portions sandwiched therebetween with the die pad suspended in the resin base and the plurality of leads extending outwardly from the package.

4 Claims, 5 Drawing Sheets

METHOD OF PRODUCING SEMICONDUCTOR PRESSURE SENSOR

BACKGROUND OF THE INVENTION

1. Field of the Invention

The present invention relates to a semiconductor pressure sensor having a semiconductor pressure sensing element packaged in a resin package and also to a method of producing this semiconductor pressure sensor.

2. Description of the Related Art

FIG. 4 is a perspective view of a known semiconductor pressure sensor of the kind described. This semiconductor pressure sensor has a semiconductor pressure sensing element 30 (see FIG. 5) accommodated in a hollow resin package 10 which is composed of a bathtub type resin base 12 and a resin cap 11 which is provided with a conduit 11a for transmitting the pressure to be sensed. External connection of the pressure sensing element 30 is achieved through leads 21 which extend outward from the package 10.

FIG. 5 is a perspective view of the known semiconductor pressure sensor illustrating the internal structure, when the semiconductor pressure sensor is being fabricated and the semiconductor sensor element 30 is carried by a lead frame, generally designated 20. The lead frame 20 includes the leads 21, a frame 22, a die pad portion 23 and suspension leads 24. The lead frame 20 is formed from a single sheet of metal by etching and press cutting such that the above-mentioned portions are formed integrally. Numeral 22a denotes a locating hole for locating the lead frame 20.

Each lead 21 has an inner lead portion electrically connected to the pressure sensing element 30, thus functioning as a lead for external electrical connection. The frame 22 is a connecting portion which surrounds the pressure sensing element 30. The frame 20 is used for the purpose of integrally holding the above-mentioned portions of the lead frame and is severed when it becomes unnecessary after the pressure sensor 30 has been correctly mounted in the package. The pressure sensing element 30 is die bonded to the die pad portion 23. After the lead frame 20 is cut in a flat form, the die pad portion 23 is displaced to such a level that the upper surface of the pressure sensing element 30 mounted on the die pad portion 23 becomes flush with the surface of the lead 21, e.g., by 2 to 3 mm. The suspension leads 24 are portions through which the die pad portion 23 is connected to the frame 22. The suspension leads 24 are deformed when the die pad portion 23 is displaced to maintain the depressed die pad portion 23 substantially parallel to the plane of the frame 22.

The semiconductor pressure sensing element 30 is die-bonded to the die pad portion 23 by means of a bonding agent 45 which may be a silicone resin. The semiconductor pressure sensing element 30 includes a glass base 32 and a semiconductor pressure sensor chip 31 bonded to the base 32. The thickness of the pressure sensor chip 31 is reduced at the central portion of the chip to, for example, several tens of $\mu$m, such that a reference pressure chamber at vacuum pressure is formed between the glass base 32 and the pressure sensor chip 31. The pressure sensor chip 31 is bonded to the base 32 by an anodic bonding technique which is known. In operation, the central portion is deflected to a convex or concave shape in response to a change in the pressure applied to the sensor chip 31. Four gauge resistors 40 on the top of the sensor chip 31 surround the central portion of reduced thickness. These four gauge resistors 40 are electrically connected in a bridge circuit (not shown).

When the central portion of the chip 31 is deflected in response to a pressure change, the gauge resistors are respectively stressed and change their resistance values. Whether the resistance value of each gauge resistor 40 increases or decreases depends on the direction of the stress generated in the gauge resistor. As a result of the changes in the resistance values of the gauge resistors 40, the balance of the bridge circuit is lost so that voltages are generated between the opposing junctions of the bridge circuit. The voltages are picked up through bonding pads 41 which serve as electrodes. After the pressure sensing element 30 is die-bonded to the die pad portion 23, the bonding pads 41 on the pressure sensor chip 31 are connected to inner leads of the leads 21 by wire bonding through gold wires 42. Consequently, the voltages generated in the bridge circuit are delivered to the exterior of the pressure sensor through the leads 21. The pressure sensing element 30 bonded to the die pad portion 23 as shown in FIG. 5 is accommodated in a package 10. The pressure sensing element 30 is a known one and detailed description of the construction thereof is omitted because the construction does not form part of the present invention.

FIGS. 6 and 7 are sectional views of the known semiconductor pressure sensor in the fully assembled state. More specifically, FIG. 6 is a sectional view taken along the line 6—6 of FIG. 4, while FIG. 7 is a sectional view taken along the line 7—7 of FIG. 4. The pressure sensing element 30 die-bonded to the upper side of the die pad portion 23 is accommodated in a bath-tub type resin base 12. In order that the lower side of the die-pad portion is securely fixed to the inner bottom surface of the resin base 12, the pressure sensing element 30 is fitted in the resin base 12 after a resin adhesive 46 is applied to the inner bottom surface of the resin base 12. Consequently, the die pad portion 23 mounting the pressure sensing element 30 is fixed in the resin base 12 by means of the adhesive 46.

Then, a resin cap 11 is bonded to the resin base 12 by means of a bond or the like (not shown) such that the lead frame 20 is sandwiched between the resin cap 11 and the resin base 12. Practically, a thermosetting resin adhesive has been applied by printing to the joint surfaces of the resin cap 11 and the resin base 12 along their peripheries, so that the resin cap 11 and the resin base 12 are bonded together by thermally setting the resin adhesive. Thus, a portion of the lead frame 20 demarcated by broken line A is sandwiched between the resin base 12 and the resin cap 11. Subsequently, unnecessary portion of the lead frame 20 are severed and removed so that only the outer lead portions of the leads 21 are left to extend from both sides of the package 10. The outer lead portions of the leads are then folded downward as shown by broken line in FIG. 6 so that, when the package 10 is mounted on a circuit board (not shown), the outer ends of the outer lead portions of the leads 21 are connected to a circuit pattern on the circuit board. Although not shown, a protective silicone gel is supplied through the pipe 11a into the package 10 until the pressure sensing element and the gold wires are completely embedded.

The known semiconductor pressure sensor is produced by the process described hereinbefore. In order to prevent cutting and short-circuiting of the wires, the gold wires are preferably short. It is therefore preferred that the top surface of the semiconductor pressure sensing element where the bonding pads are provided be flush with the leads of the lead frame. Since the semiconductor pressure sensor element has a height of 2 to 3 mm, it is necessary that the die pad portion of the lead frame be displaced 2 to 3 mm below the plane of the frame, i.e., the plane of the surfaces of the leads. To this end, in the production of the known sensor, the lead frame formed from a single metal sheet by etching and stamping is formed in such a manner that the die pad portion is cantilevered by the suspension leads 24 and the suspension leads 24 are deformed by a press to displace the die pad portion. This known method, however, suffers from the following problem due to the large amount of displacement. Namely, after the die bonding of the pressure sensing element to the die pad portion and the wire bonding by the gold wires, the die pad portion carrying the pressure sensing element tends to be displaced vertically in the course of handling of the lead frame, e.g., fitting of the lead frame in the resin base, with the result that the gold wire loops are deformed or cut. In addition, since the die pad portion is cantilevered, it is necessary to fix the die pad portion in the resin base by means of an adhesive. Consequently, the pressure sensing element tends to be stressed by the resin base to which it is fixed, and is liable to be subjected to impact and vibration transmitted through the resin base.

SUMMARY OF THE INVENTION

Accordingly, an object of the present invention is to provide a semiconductor pressure sensor in which the rigidity of the die pad portion, as well as the rigidity of the whole lead frame, is increased so as to prevent deformation and cutting of the gold wire loops during handling of the lead frame after wire bonding and so as to eliminate necessity for bonding the lower side of the die pad portion to the resin base, as well as a method of producing such a semiconductor pressure sensor.

To this end, according to one aspect of the present invention, there is provided a method of producing a semiconductor pressure sensor which has a semiconductor pressure sensing element and a hollow package in which the element is mounted, the method comprising the steps of: forming a first lead frame portion and a second lead frame portion by cutting from a sheet of metal, the first lead frame portion having a die pad portion which is supported at its opposing sides, the second lead frame portion having a plurality of leads; displacing the die pad portion of the first lead frame portion to a depth, relative to the remainder to the lead frame, corresponding to the height of the semiconductor pressure sensing element; superposing the first and second lead frame portions and integrally connecting them so as to form an integrated lead frame having a high level of rigidity; die bonding the semiconductor pressure sensing element to the die pad portion of the first lead frame; wire bonding electrical connections between the semiconductor pressure sensing element and the plurality of leads of the second lead frame portion; packaging the semiconductor pressure sensing element in a package in such a manner that the die pad portion to which the semiconductor pressure sensing element has been bonded is suspended in the package through a plurality of suspension leads and such that the outer lead portions of the plurality of leads extend outward from the package; and cutting and removing unnecessary portions of the lead frame to separate the leads into discrete form and then deforming the leads into a predetermined configuration.

According to another aspect of the present invention, there is provided a semiconductor pressure sensor produced in accordance with the method described above.

According to the method of the present invention for producing a semiconductor pressure sensor, the first lead frame having a depressed die pad portion suspended by suspension leads at both sides and the second lead frame having leads are formed separately and then integrated with each other by spot welding, so that the rigidity of the die pad portion and of the whole frame are increased.

The die pad portion in the semiconductor pressure sensor of the invention has a large rigidity so that it need not be fixed to the bottom of the package. Consequently, the semiconductor pressure sensing element is freed from mechanical stress, impact and vibration which otherwise may be applied thereto through the package.

The above and other objects, features and advantages of the present invention will become clear from the following description of the preferred embodiments taken in conjunction with the accompanying drawings.

DESCRIPTION OF THE PREFERRED EMBODIMENTS

Figure 1:
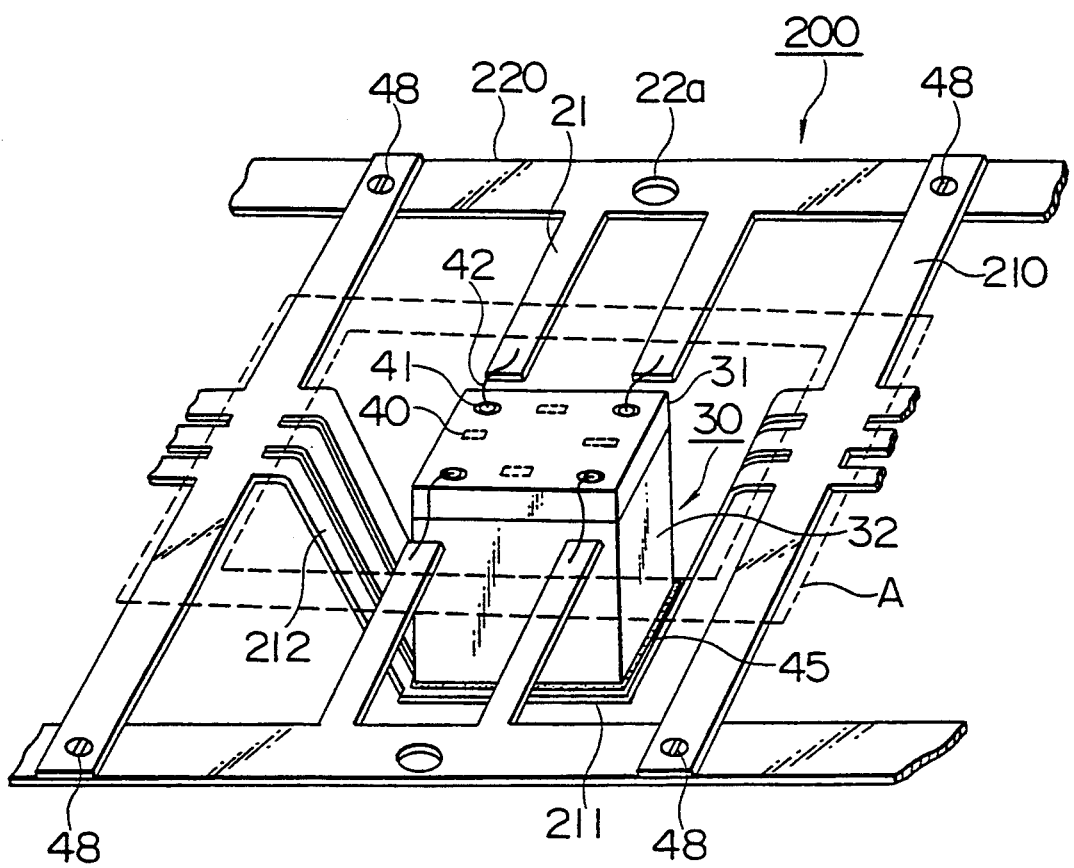
FIG. 1 is a perspective view of an embodiment of the semiconductor pressure sensor in the course of manufacture, showing a semiconductor pressure sensing element mounted on a lead frame.

Preferred embodiments of the present invention will be described with reference to the accompanying drawings. In the following description, the same reference numerals are used to denote the same parts as those employed in the known art described before.

Figure 2A:
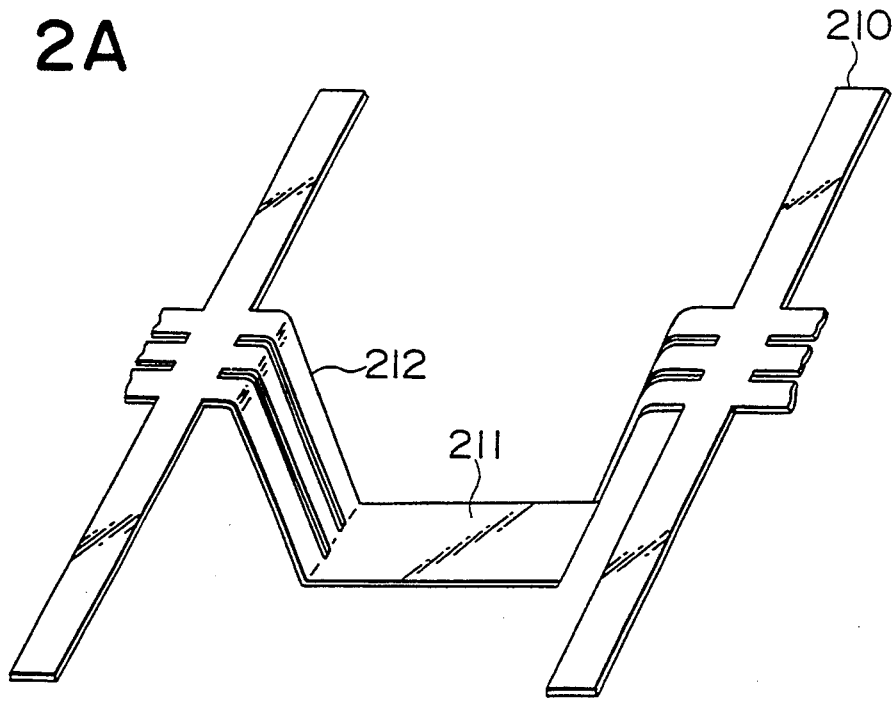
FIG. 2A is a perspective view of a first lead frame portion of the lead frame shown in FIG. 1.
Figure 2B:
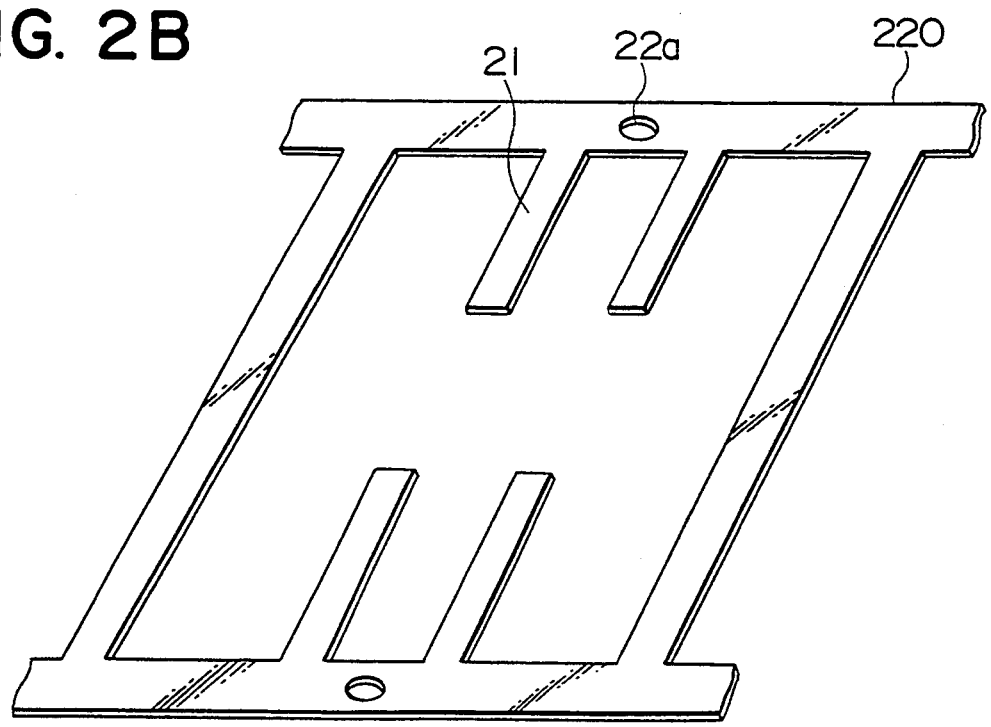
FIG. 2B is a perspective view of a second lead frame portion of the lead frame shown in FIG. 1.
Figure 3:
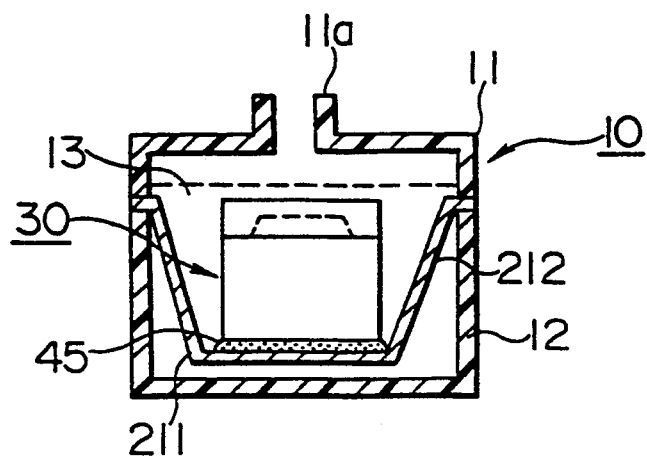
FIG. 3 is a sectional view of a semiconductor pressure sensor embodying the present invention.
Figure 4:
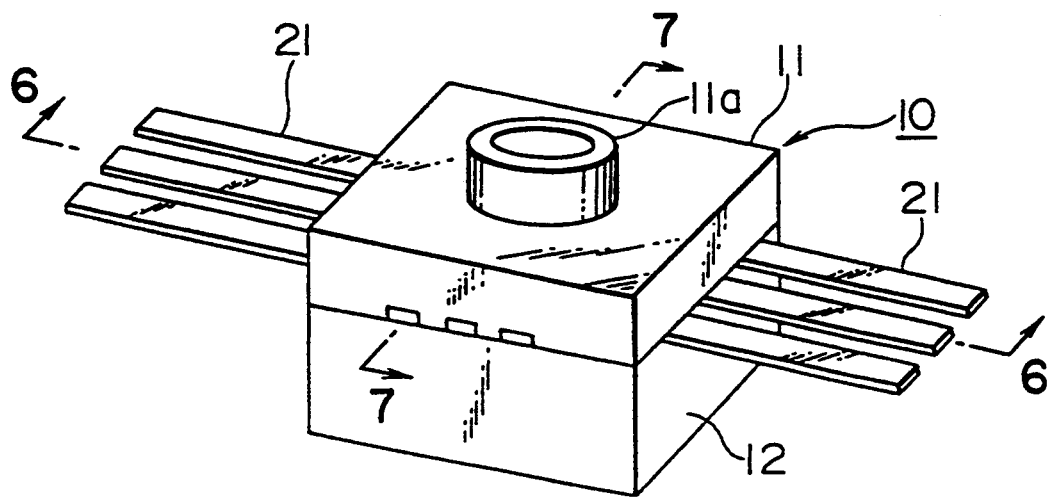
FIG. 4 is a perspective view of a semiconductor pressure sensor of the type to which the invention pertains.
Figure 5:
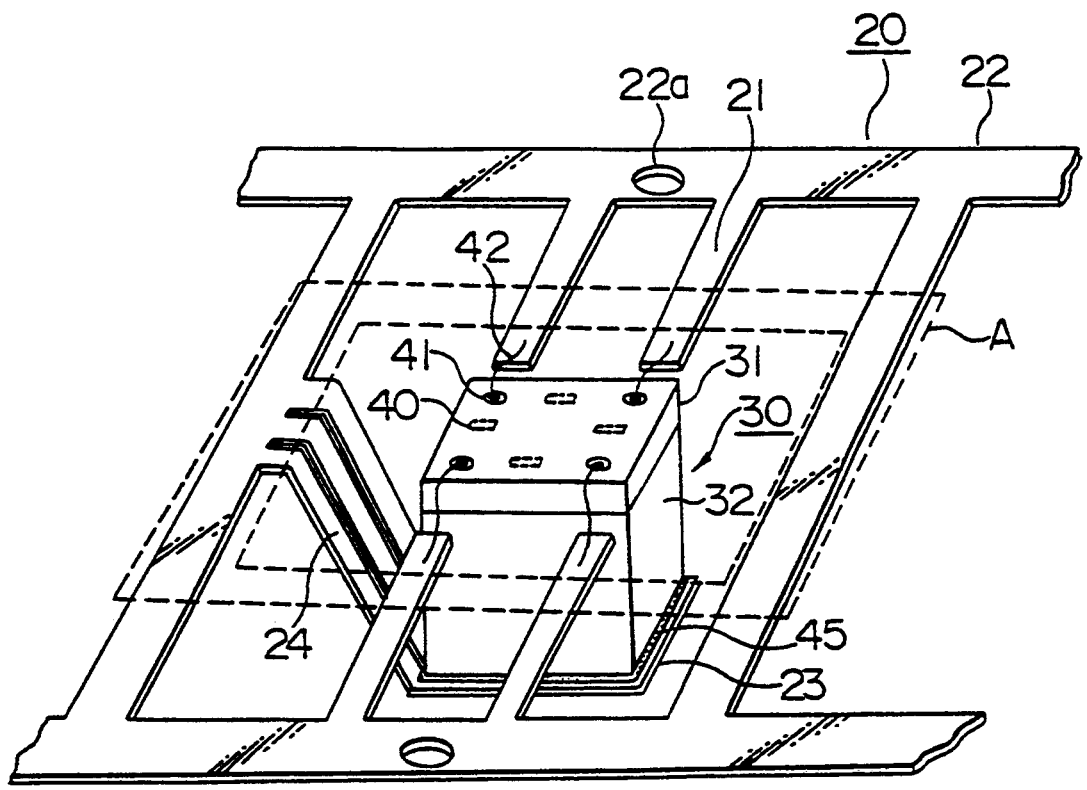
FIG. 5 is a perspective view of a known semiconductor pressure sensor in the course of manufacture, showing a semiconductor sensing element mounted on a lead frame.
Figure 6:
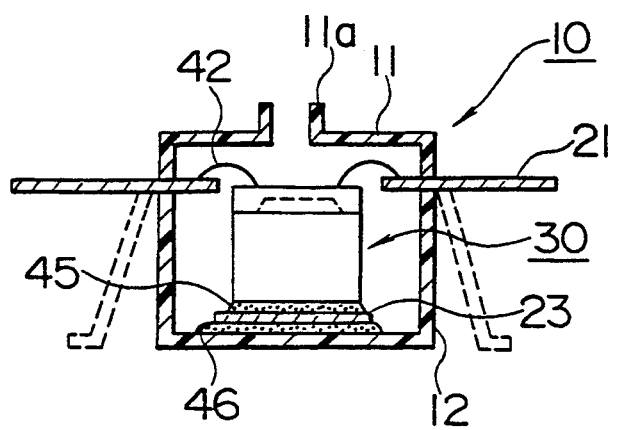
FIG. 6 is a sectional view of the known semiconductor pressure sensor taken along the line 6—6 of FIG. 4.
Figure 7:
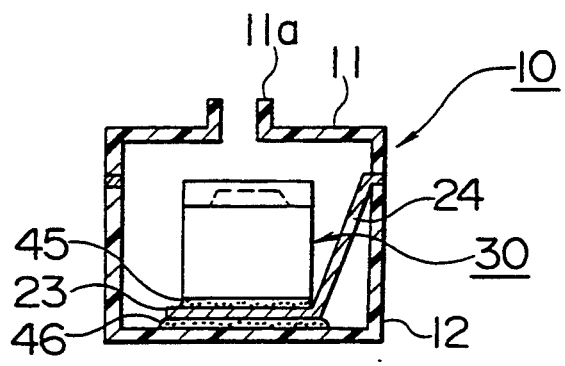
FIG. 7 is a sectional view of the known semiconductor pressure sensor taken along the line 7—7 of FIG. 4.

The semiconductor pressure sensor of the present invention has an appearance which is the same as that shown in FIG. 4. Thus, the semiconductor pressure sensor of the present invention has, as in the case of the known sensor described before, a package 10 including a resin cap 11 provided with a conduit portion 11a and a resin base 12. The semiconductor pressure sensor of the invention has a semiconductor pressure sensing element 30 which has the same construction as the known sensor. Namely, the semiconductor pressure sensing element 30 has a semiconductor pressure sensor chip 31 and a glass base 32. FIG. 1 illustrates an embodiment of the semiconductor pressure sensor of the invention in the course of manufacture and shows particularly the pressure sensing element 30 which has been mounted on a lead frame 200. The lead frame 200 includes a first lead frame portion 210 and a second lead frame portion 220 which are separately shown in FIGS. 2A and 2B. FIG. 3 shows a section of the semiconductor pressure sensor of the present invention. The section of this semiconductor pressure sensor taken along the line 6—6 is the same as the sectional view of the known semiconductor pressure sensor shown in FIG. 6 and, therefore, is omitted from the drawings.

The construction of the semiconductor pressure sensor of the present invention will be described with reference to a production process. A known Fe—Ni alloy sheet of about 0.25 mm thick is prepared as the material of the lead frame, and blanks of a predetermined shape are formed from this sheet by etching or stamping, whereby the first lead frame portion 210 having a portion which is to form a die pad portion as shown in FIG. 2A and a second lead frame portion 220 as shown in FIG. 2B are separately formed. The die pad portion 211 of the first lead frame portion 210 has to be displaced by an amount corresponding to the height of the semiconductor pressure sensing element 30 which is to be mounted in the die pad portion 211. To this end, pressure is applied after the formation of the first lead frame portion 210, thereby depressing the die pad portion 211. In order to improve resistance to the environment, the first lead frame 210 and the second lead frame portion 220 are respectively plated with nickel and gold. Then, the first and second lead frame portions 210 and 220 are superposed in alignment with each other, and spot welding is conducted at each of four points 48 shown in FIG. 1, whereby the lead frame 200 is completed.

The semiconductor pressure sensing element 30 includes a semiconductor pressure sensor chip 31 which is fixed by anodic bonding to the glass base 32 made of pyrex glass. As shown in FIG. 1, this semiconductor pressure sensing element 30 is die bonded to the die pad portion 211 by means of an adhesive 45 such as, for example, a silicone resin adhesive. The pressure sensor chip 31 has at the top surface bonding pads 41 which serve as electrodes of the pressure sensor chip 31. These bonding pads 41 are then electrically connected to corresponding leads 21 of the lead frame 200 by wire bonding through gold wires 42 having a diameter of about 35 μm.

A bath-tub type resin base 12 (see FIG. 3) is also prepared, with an adhesive (not shown) such as an epoxy resin applied by screen printing to the joint surface along the periphery thereof. Then, the semiconductor pressure sensing element 30 in the state shown in FIG. 1, bonded to the die pad portion 211 of the lead frame 200, is fitted in the resin base 12. Then, a resin cap 11, which also has a joint surface to which an adhesive (not shown) of, for example, epoxy resin type has been applied by screen printing, is placed on the resin base 12, such that the lead frame 200 is sandwiched between the joint surfaces of the resin base 12 and the resin cap 11. Consequently, the portion of the lead frame 200 indicated by broken line A in FIG. 1 is sandwiched between the resin cap 11 and the resin base 12. Then, an after curing operation thermally sets the thermosetting resin, such as an epoxy resin, whereby the resin base 12 and the resin cap 11 are bonded together with the lead frame 200 between them.

Subsequently, a protective gel, e.g., a silicone gel, for protecting the pressure sensing element 30 is introduced into the package 10 through the conduit portion 11a of the resin cap 11 until the pressure sensing element 30 and the gold wires 42 are completely embedded as shown by broken line 13 in FIG. 3. Then, after the protective gel has been cured, unnecessary portions of the lead frame 200 are removed by cutting, whereby the outer lead portions of the leads are left extending outward from the package 10. Then, the outer lead portions of the leads 21 are deformed as shown by broken lines in FIG. 6, as in the case of the known semiconductor pressure sensor described before.

In the semiconductor pressure sensor of the invention having the described construction, the whole lead frame 200 and the die pad portion 211 exhibit high levels of rigidity. Therefore, problems encountered with known semiconductor pressure sensor, such as deformation or cutting of gold wires 42 which are extremely thin and weak, caused by distortion of the lead frame 200 by external force during handling, are remarkably suppressed, thus facilitating handling of the lead frame 200 after the wire bonding. In particular, it is to be noted that the rigidity of the die pad portion is remarkably increased because it is suspended at both sides by the suspension leads 212. This also eliminates necessity for fixing the die pad portion 211 to the inner bottom surface of the resin base 12, thus eliminating mechanical stress in the semiconductor sensing element 30, as well as impact and vibration of the same, which heretofore have inevitably occurred due to fixing of the die pad portion to the inner bottom surface of the resin base.

As will be understood from the foregoing description, the lead frame used in the semiconductor pressure sensor of the present invention is formed by separately preparing the first lead frame portion having a portion which is to form the die pad portion and the second lead frame portion, and integrating these portions through spot welding. Consequently, the die pad portion and the whole lead frame exhibit high levels of rigidity, so that undesirable deformation and cutting of gold wire loops, which heretofore have inevitably occurred due to displacement of the die pad portion up and down and to the left and right after the wire bonding, can be remarkably suppressed, thereby offering a high degree of reliability in a hollow resin package type semiconductor pressure sensor.

What is claimed is:

1. A method of producing a semiconductor pressure sensor comprising:
    forming a first lead frame portion and a second lead frame portion by cutting a sheet of metal, said first lead frame portion having a die pad and a plurality of interconnected suspension leads supporting said die pad at opposing sides, said second lead frame portion having a plurality of leads;
    displacing said die pad of said first lead frame portion to a depth, relative to parts of said suspension leads, corresponding to a height of a semiconductor pressure sensing element;
    superposing and contacting said first and second lead frame portions and connecting said first lead frame portion to said second lead frame portion to form an integrated lead frame having a high rigidity;
    die bonding a semiconductor pressure sensing element to said die pad of said first lead frame portion;

wire bonding to electrically connect said semiconductor pressure sensing element to said plurality of leads of said second lead frame portion;

packaging said semiconductor pressure sensing element in a hollow package without attaching said die pad to said hollow package, with said die pad suspended within and spaced from said hollow package by said plurality of suspension leads, and with outer portions of said plurality of leads extending through and outwardly from said hollow package; and cutting and removing unnecessary portions of said integrated lead frame, thereby separating said plurality of leads into discrete leads and then deforming said outer portions of said discrete leads into a predetermined configuration.

2. The method according to claim 1 including connecting said first lead frame portion to said second lead frame portion by spot-welding.

3. The method according to claim 1 wherein said first and second lead frame portions are formed from an Fe—Ni alloy including plating, prior to connecting said first lead portion to said second lead portion, said first and second lead portions with nickel and gold, respectively.

4. The method according to claim 1 wherein said hollow package includes a hollow resin base receiving said semiconductor pressure sensing element bonded to said die pad and a hollow resin cap having a conduit for introducing a pressure to be sensed by said semiconductor pressure sensing element wherein packaging said semiconductor pressure sensor in said package includes bonding said hollow resin base to said hollow resin cap.

* * * * *